United States Patent
Shima et al.

(12) 
(10) Patent No.: US 6,777,728 B2
(45) Date of Patent: Aug. 17, 2004

(54) SEMICONDUCTOR DEVICE AND COMPLEMENTARY SEMICONDUCTOR DEVICE

(75) Inventors: Masashi Shima, Kawasaki (JP); Tetsuji Ueno, Kawasaki (JP); Yoshiki Sakuma, Ebina (JP); Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 10/329,773

(22) Filed: Dec. 27, 2002

(65) Prior Publication Data
US 2003/0155592 A1 Aug. 21, 2003

(30) Foreign Application Priority Data
Dec. 28, 2001 (JP) ........................................ 2001-399595

(51) Int. Cl.[7] ...................... H01L 29/76; H01L 21/336
(52) U.S. Cl. .................. 257/288; 257/285; 257/286; 257/287; 257/335; 257/333; 257/334
(58) Field of Search ................................. 257/286, 287, 257/288, 332, 337, 334, 335, 369, 192, 194, 256, 265, 272, 15, 18, 24, 195, 190, 191; 478/191, 196, 197; 357/4, 16, 22

(56) References Cited

U.S. PATENT DOCUMENTS

| | | | | |
|---|---|---|---|---|
| 4,862,228 A | * | 8/1989 | Ralph | 257/14 |
| 5,479,033 A | * | 12/1995 | Baca et al. | 257/192 |
| 6,350,993 B1 | * | 2/2002 | Chu et al. | 257/19 |

* cited by examiner

*Primary Examiner*—Nathan J. Flynn
*Assistant Examiner*—Fazli Erdem
(74) *Attorney, Agent, or Firm*—Westerman, Hattori, Daniels & Adrian, LLP

(57) ABSTRACT

A semiconductor device includes a channel layer, a gate electrode formed on the channel layer, a p-type source region formed on a first side of the channel layer, and a p-type drain region formed on a second side of the channel layer. A heavy-hole band and a light-hole band are separated by compressive strain applied isotropically in an in-plane direction in the channel layer. A channel direction connecting the p-type source and drain regions is set substantially to a direction to maximize hole mobility in the channel layer.

14 Claims, 16 Drawing Sheets

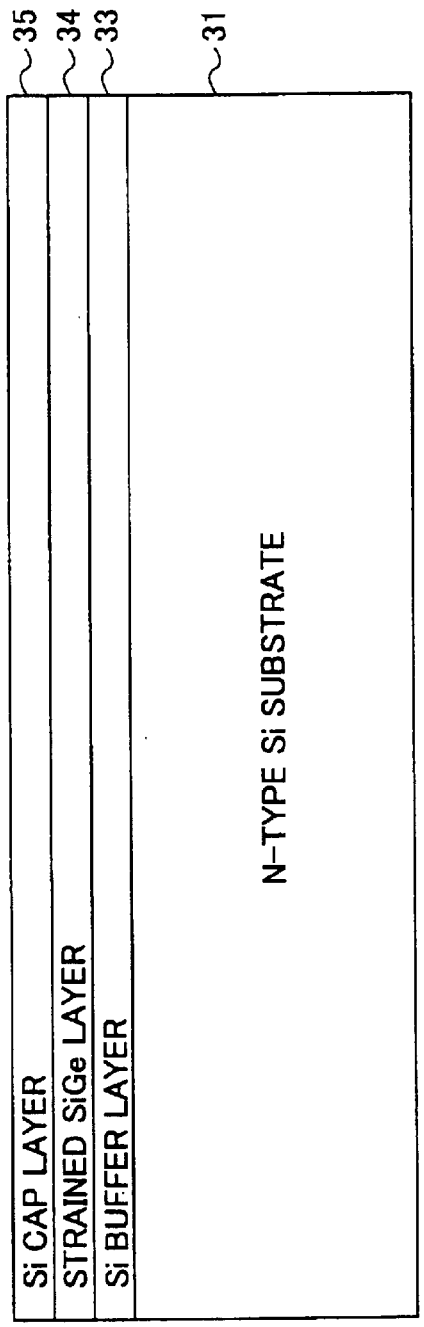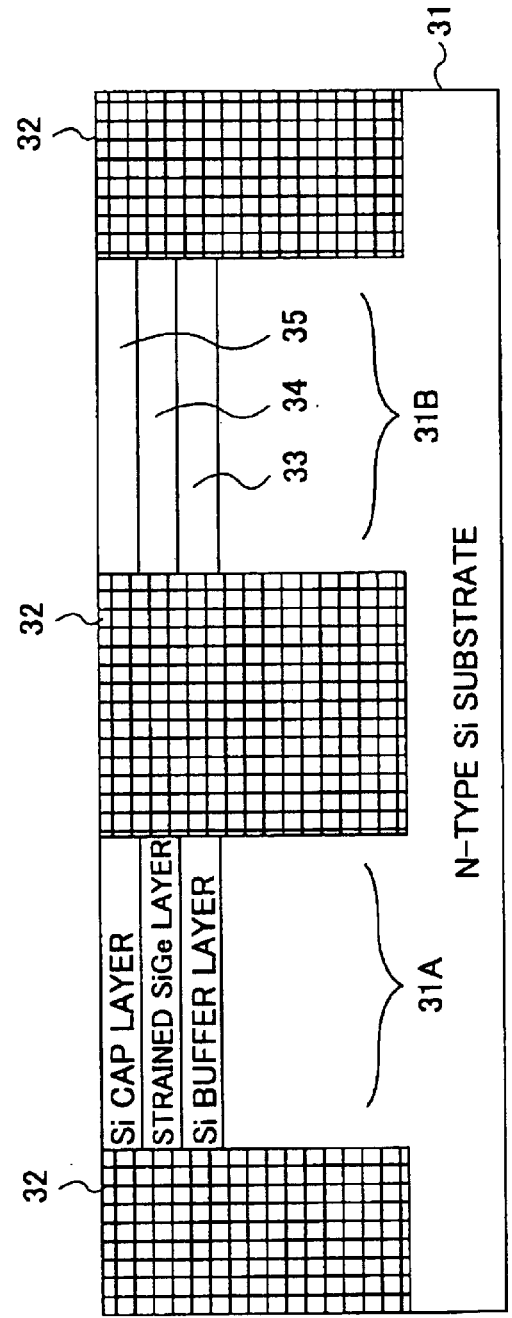
FIG.11A
FIG.11B

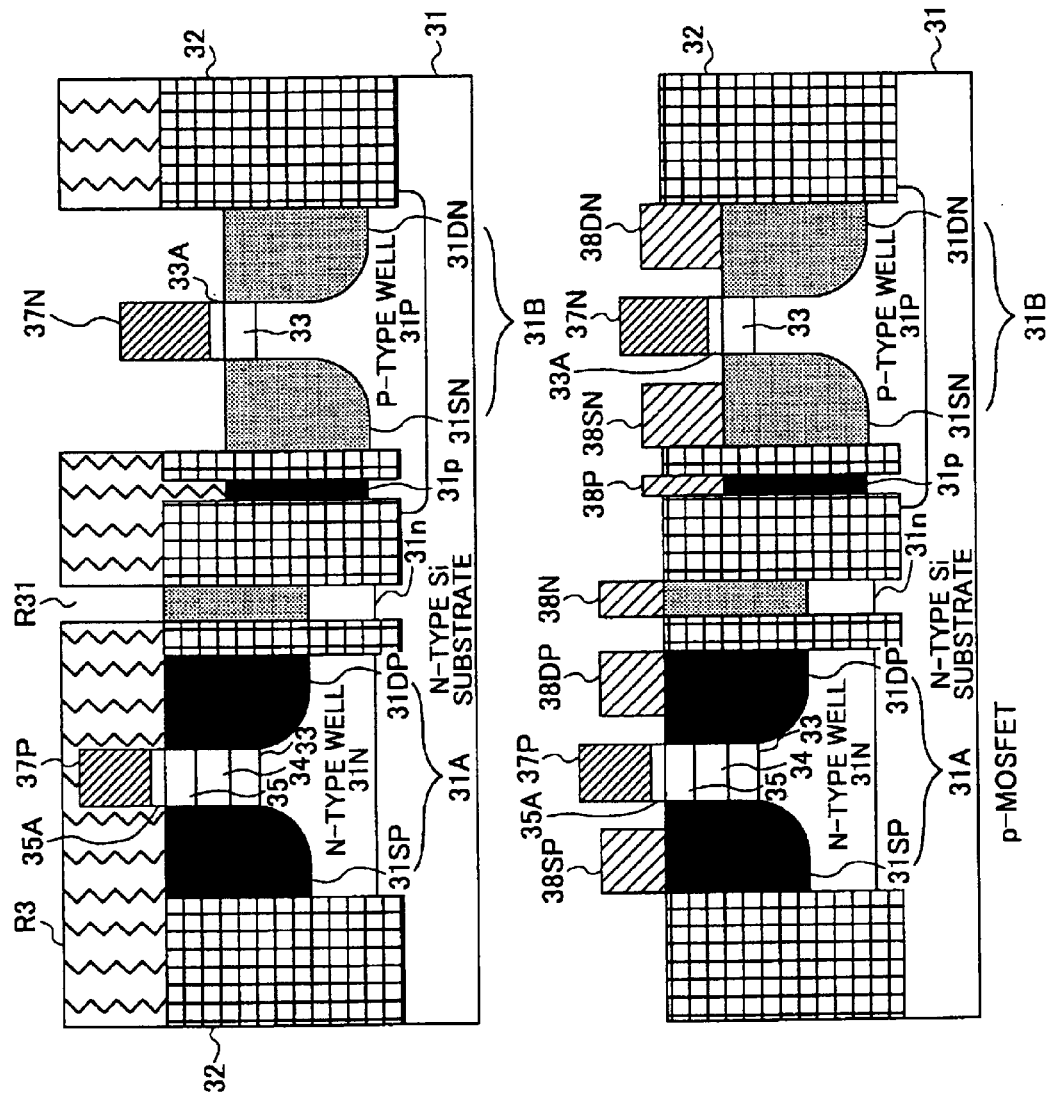

SEMICONDUCTOR DEVICE AND COMPLEMENTARY SEMICONDUCTOR DEVICE

CROSS-REFERENCE TO RELATED APPLICATION

The present application is based on Japanese priority application No. 2001-399595 filed on Dec. 28, 2001, the entire contents of which are hereby incorporated by reference.

BACKGROUND OF THE INVENTION

1. Field of the Invention

The present invention generally relates to semiconductor devices, and more particularly to a high-speed semiconductor device having enhanced hole mobility.

2. Description of the Related Art

Si crystal-based semiconductor devices are widely used for a variety of purposes ranging from a high-speed logic element to a memory device. Focusing particularly on very high-speed logic elements, conventionally, the very high-speed logic elements are formed mainly of a compound semiconductor using a compound having small electron effective mass and high electron mobility, such as GaAs, since electron and hole mobility are limited in Si single crystals.

However, it is difficult to integrate a GaAs-based semiconductor device with a Si-based semiconductor device, and the carrier is limited to electrons, thus making it impossible to form a complementary semiconductor device using p-channel and n-channel elements.

Meanwhile, recently, very high-speed semiconductor devices boasting enhanced electron mobility have been realized with strained Si single crystals. Those Si crystal-based very high-speed semiconductor devices operate at higher speeds than the compound semiconductors.

With respect to those very high-speed semiconductor devices, there is a demand for forming a complementary semiconductor device, such as a CMOS (complementary metal oxide semiconductor) circuit, using p-channel and n-channel elements. Conventionally, however, hole mobility is prevented from being improved sufficiently in the p-channel element although electron mobility is greatly improved in the n-channel element by introducing the strain. Therefore, it is difficult to realize such a complementary semiconductor device particularly in the form of a high-density integrated circuit.

FIG. 1 is a diagram showing a valence band structure in Si crystal.

According to FIG. 1, the valence band of Si crystal includes a light-hole (LH) band and a heavy-hole (HH) band. In Si crystal, the ground states of those bands are degenerated. Therefore, in a semiconductor device using such Si crystal as a channel and holes as carriers, holes on the LH band are easily scattered to the HH band or the reverse scattering occurs, so that hole mobility is limited. As a result, the operation speed of the semiconductor device is also limited, thus making it difficult to realize very high-speed operation using Si crystal as a channel.

On the other hand, FIG. 2 is a diagram showing a band structure in SiGe mixed crystal compressed isotropically in an in-plane direction.

FIG. 2 shows that by using SiGe mixed crystal, the LH band turns sharply at its ground part so that the hole effective mass m* defined by the following equation is reduced.

$$m^* = \frac{\hbar^2}{d^2\varepsilon/dk^2}$$

Accordingly, hole mobility on the LH band is increased compared with the case of Si crystal of FIG. 1.

The band structure of FIG. 2 shows that the degeneration between the LH band and the HH band is canceled by applying two-dimensional isotropic compressive stress to the SiGe mixed crystal, and that the HH band is located above the LH band, that is, on the lower energy side. Accordingly, in such a band structure, the holes of the valence band exit mainly on the low-energy HH band so as to suppress hole scattering between those two bands. However, since the hole effective mass is great on the HH band, there is a limit to the desired improvement in hole mobility and to an increase in the operation speed of a p-channel MOS transistor using holes as carriers.

SUMMARY OF THE INVENTION

Accordingly, it is a general object of the present invention to provide a novel and useful semiconductor device in which the foregoing disadvantage is eliminated.

A more specific object of the present invention is to maximize hole mobility in a semiconductor device using holes as carriers.

Another more specific object of the present invention is, in a complementary semiconductor device including a p-channel device using holes as carriers and an n-channel device using electrons as carriers, to maximize hole mobility in the p-channel device by using strained SiGe crystal as a channel region.

Yet another more specific object of the present invention is, in a complementary semiconductor device including a p-channel device using holes as carriers and an n-channel device using electrons as carriers, to maximize hole mobility in the p-channel device by using strained SiGe crystal as a channel region and to simultaneously maximize electron mobility in the n-channel device.

The above objects of the present invention are achieved by a semiconductor device including a channel layer, a gate electrode formed on the channel layer, a p-type source region formed on a first side of the channel layer, and a p-type drain region formed on a second side of the channel layer, wherein a heavy-hole band and a light-hole band are separated by compressive strain applied isotropically in an in-plane direction in the channel layer, and a channel direction connecting said p-type source and drain regions is set substantially to a direction to maximize hole mobility in the channel layer.

According to the present invention, in a semiconductor device in which a heavy-hole band and a light-hole band are separated in a channel layer by the effect of compressive stress applied thereto isotropically in an in-plane direction, hole mobility in the channel layer can be maximized by setting the channel direction in which holes are transported preferably to around <100> instead of conventional <110>. Thereby, the operation speed of the p-channel field effect transistor (FET) can be maximized.

The above objects of the present invention are also achieved by a complementary semiconductor device including a Si substrate whose main surface is substantially a (001)

crystal surface, a p-channel field-effect transistor (FET) formed in a first region of the Si substrate, and an n-channel field-effect transistor (FET) formed in a second region of the Si substrate, wherein the p-channel FET includes: a p-channel region formed of a mixed crystal layer including at least Si and Ge and storing compressive strain, the mixed crystal layer grown epitaxially in the first region on the Si substrate; a first gate electrode formed on the p-channel region; a p-type first diffusion region formed on a first side of the p-channel region; and a p-type second diffusion region formed on a second side of the p-channel region; the n-channel FET includes: an n-channel region formed of a Si layer grown epitaxially in the second region on the Si substrate; a second gate electrode formed on the n-channel region; an n-type third diffusion region formed on a first side of the n-channel region; and an n-type fourth diffusion region formed on a second side of the n-channel region; and a channel direction connecting the first and second diffusion regions is set to a direction deviating from a <110> direction in the p-channel FET.

According to the present invention, by forming a p-channel FET and an n-channel FET on a common Si substrate in a direction to particularly maximize the hole mobility of the p-channel FET, that is, by forming the p-channel and n-channel FETs in different directions, the hole mobility, or the operation speed, of the p-channel FET is maximized, while the electron mobility, or the operation speed, of the n-channel FET is prevented from being reduced. In such a complementary semiconductor device, the difference between the hole mobility of the p-channel and the electron mobility of the n-channel FETs can be reduced, so that the two transistors can be formed in a simple rectangular device region, which is advantageous in terms of integration. Therefore, the integration density of a semiconductor integrated circuit can be increased.

BRIEF DESCRIPTION OF THE DRAWINGS

Other objects, features and advantages of the present invention will become more apparent from the following detailed description when read in conjunction with the accompanying drawings, in which:

FIGS. 11A through 11H are diagrams for illustrating a process of manufacturing the complementary semiconductor device of FIG. 10 according to the second embodiment of the present invention;

DETAILED DESCRIPTION OF THE PREFERRED EMBODIMENTS

[Principles]

First, a description will be given of the principles of the present invention.

Figure 3:
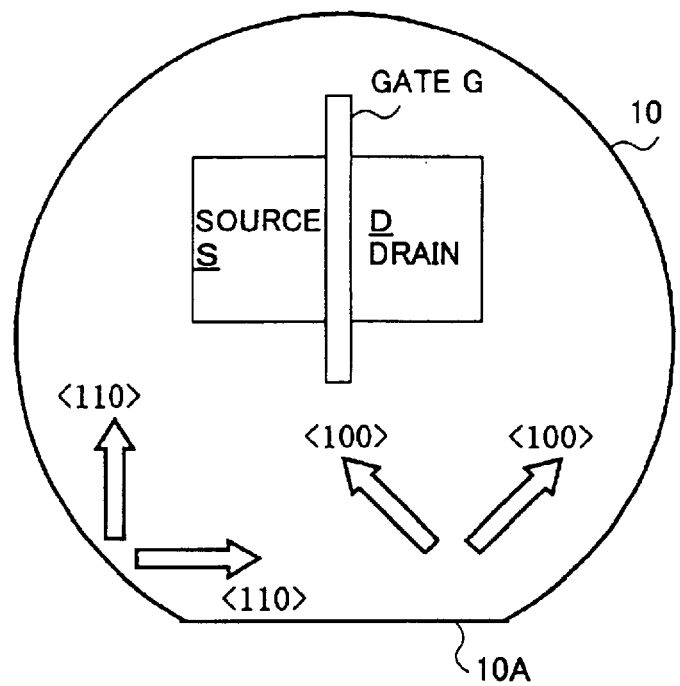
FIG. 3 is a diagram for illustrating directions on the Si substrate of a conventional MOSFET.

FIG. 3 is a diagram showing a conventional (001) Si wafer 10 commonly used.

According to FIG. 3, the Si wafer 10 has an orientation flat 10A in the <110> direction. Normally, a field-effect semiconductor device such as a MOSFET is formed on the Si wafer 10 so that the direction of a channel connecting a source region S and a drain region D is oriented in the <110> direction, irrespective of whether the field-effect semiconductor device is of a p-channel type or an n-channel type. As a result, a gate electrode G extends in the <110> direction in FIG. 3.

Figure 2:
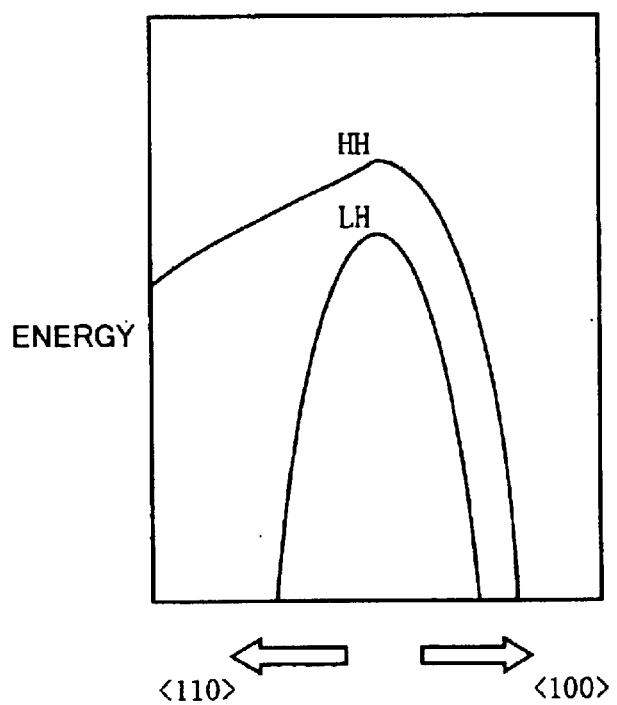
FIG. 2 is a diagram showing a valence band structure of SiGe mixed crystal storing compressed strain.

In the case of forming a p-channel field-effect semiconductor device with such a configuration, holes are transported in the <110> direction from the source S to the drain D in the channel right under the gate electrode G. As previously described with reference to FIG. 2, the hole effective mass m* is great on the HH band on which the holes mainly exist in this direction, so that the semiconductor device is prevented from operating at higher speed.

Figure 4:
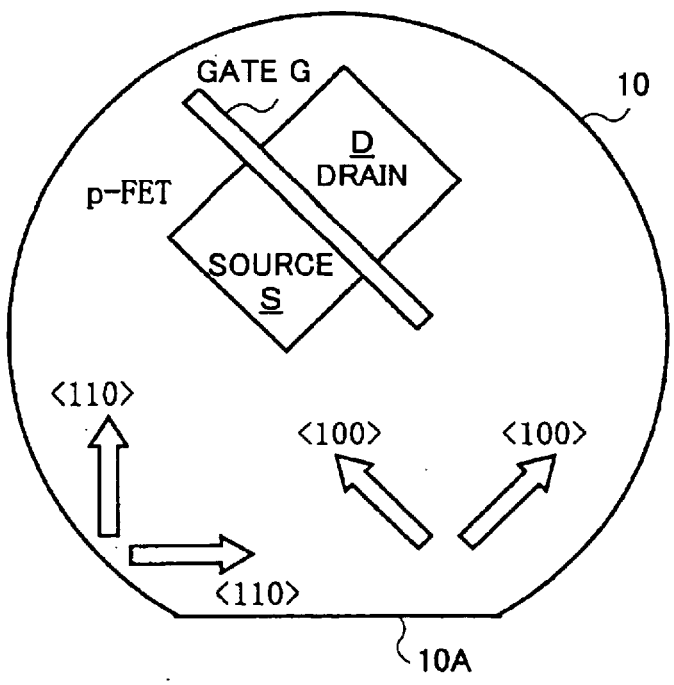
FIG. 4 is a diagram for illustrating the principles of the present invention.

On the other hand, FIG. 4 is a diagram showing the principles of a p-channel field-effect semiconductor device according to the present invention.

As shown in FIG. 4, according to the present invention, the gate electrode G of the p-channel field-effect semiconductor device is provided in the <100> direction, and accordingly, the direction of the channel is set to the <100> direction or a direction close thereto. In this case, as can be seen from FIG. 2, the hole effective mass m* is extremely small even on the HH band in this direction, so that the p-channel field-effect semiconductor device operates at much higher speeds than in the case of setting the direction of the channel to the conventional <110> direction.

A description will now be given, with reference to the accompanying drawings, of embodiments of the present invention.

[First Embodiment]

Figure 5:
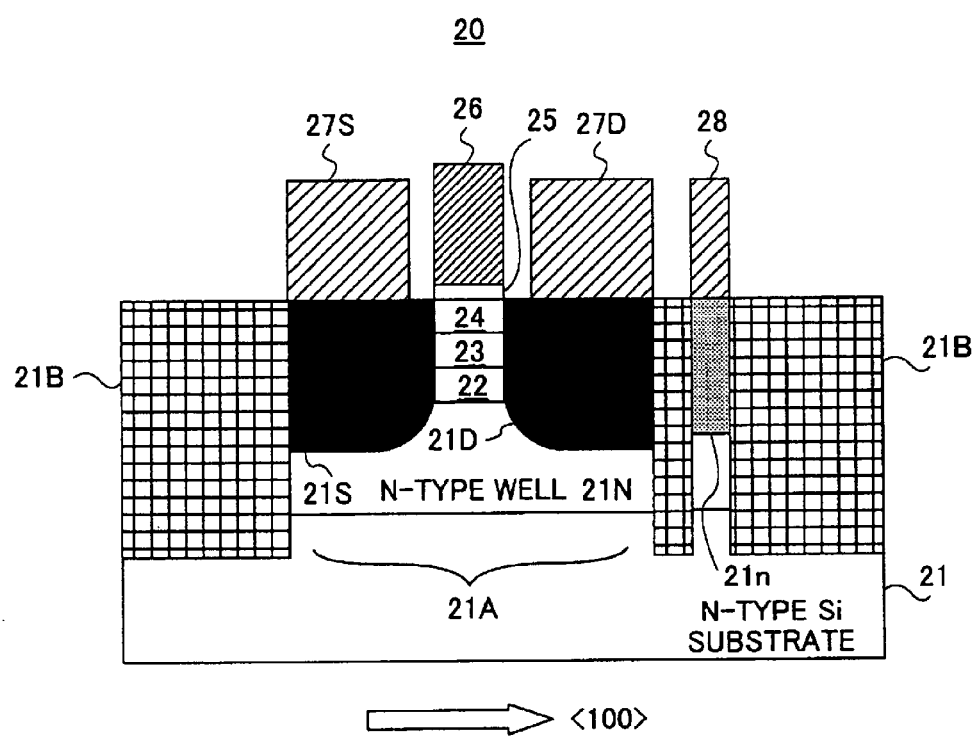
FIG. 5 is a diagram showing a configuration of a p-channel MOS transistor according to a first embodiment of the present invention.

FIG. 5 is a diagram showing the configuration of a p-channel MOS transistor 20 according to a first embodiment of the present invention.

As shown in FIG. 5, the p-channel MOS transistor 20 is formed on an n-type Si (001) substrate 21 of a carrier density of approximately $1 \times 10^{16}$ cm$^{-3}$. On the Si (001) substrate 21, a Si buffer layer 22 of 100 nm in thickness, a 10 nm-thick SiGe mixed crystal layer 23 including approximately 20 atomic percent Ge, and a Si cap layer 24 of 11 nm in thickness are successively grown epitaxially.

In the Si substrate 21, a device region 21A where the MOS transistor 20 is formed is surrounded by an isolation structure 21B. An n-type impurity such as P is introduced into the device region 21A. As a result, an n-type well 21N corresponding to the device region 21A is formed in the Si substrate 21. Further, the Si buffer layer 22, the Si cap layer 24, and the SiGe mixed crystal layer 23 are doped n-type. The SiGe layer 23, which is grown epitaxially on the Si substrate 21, stores isotropic compressed strain in the in-plane direction. The film thickness of the SiGe layer 23 is set to be smaller than or equal to the critical film thickness at which a defect such as dislocation occurs in the SiGe layer 23.

Further, according to the structure of FIG. 5, an oxide film 25 is formed on the Si cap layer 24 as a gate insulating film, and a gate electrode 26 is formed on the gate oxide film 25.

In the device region 21A, a p-type diffusion region 21S into which a p-type impurity such as B is introduced is formed on one side of the gate electrode 26, and the same p-type diffusion region 21D is formed on the other side of the gate electrode 26. An ohmic electrode 27S is formed on the diffusion region 21S and another ohmic electrode 27D is formed on the diffusion region 21D.

According to FIG. 5, a contact structure that exposes the surface of the Si cap layer 24 is formed in proximity to the device region 21A in the isolation structure 21B. An n-type contact region (body contact region) 21n is formed in the contact structure by introducing thereinto an n-type dopant such as P so that the dopant reaches the n-type well 21N. An ohmic electrode 28 is formed on the n-type contact region 21n as a body electrode.

In the p-channel MOS transistor 20 of FIG. 5, the gate electrode 26 extends in the <100> direction as shown in FIG. 4. Consequently, a hole channel is formed in the SiGe mixed crystal layer 23 between the diffusion regions 21A and 21D so as to extend in the <100> direction.

Figure 6:
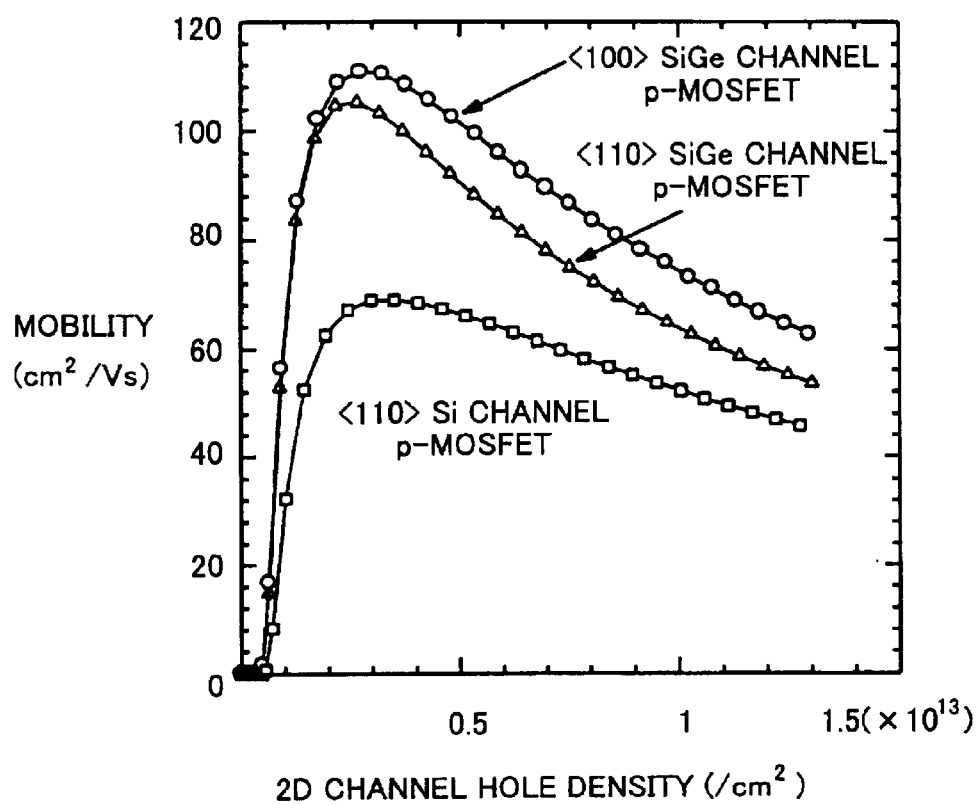
FIG. 6 is a diagram showing the operation characteristics of the MOS transistor of FIG. 5.

FIG. 6 is a graph showing the results of hole mobility measurements performed on the p-channel MOS transistor 20 of FIG. 5. In FIG. 6, the vertical axis represents hole mobility and the horizontal axis represents two-dimensional channel hole density. FIG. 6 also shows, for the purpose of comparison, the results of the case of setting the hole channel direction to the conventional <110> direction and the case of setting the hole channel direction to the conventional <110> direction using the conventional Si channel layer.

FIG. 6 shows that by using SiGe mixed crystal containing compressive stress, hole mobility is greatly enhanced compared with the case of using the conventional Si single crystal as a channel layer, and that particularly, by changing the channel direction from the conventional <110> direction to the <100> direction as shown in FIG. 4, the maximum hole mobility of 115 cm$^2$/Vs can be achieved.

Figure 7:
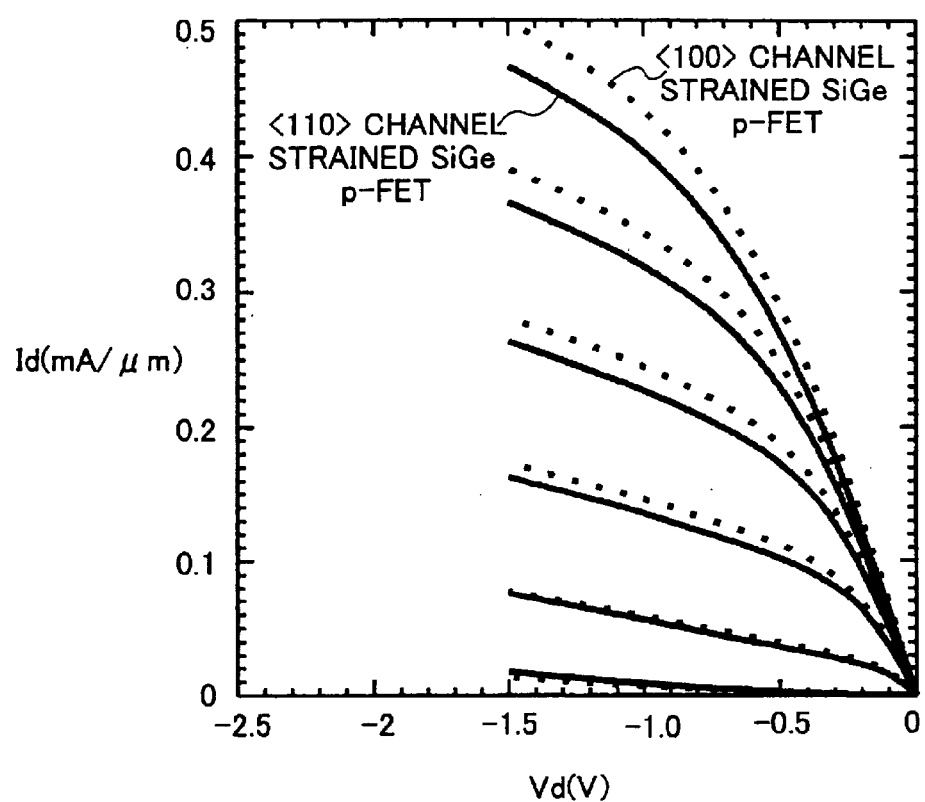
FIG. 7 is another diagram showing the operation characteristics of the MOS transistor of FIG. 5.

FIG. 7 is a diagram showing the current-voltage characteristics of the MOS transistor 20 of FIG. 5. In FIG. 7, the vertical axis represents drain current Id, and the horizontal axis represents drain voltage Vd. Further, in FIG. 7, the solid lines indicate the characteristics in the case of the conventional <110> channel direction, and the broken lines indicate the characteristics in the case of the <100> channel direction of the present invention.

FIG. 7 shows that the drain current Id increases by setting the channel direction to <100>.

[Second Embodiment]

In the case of integrating such a p-channel MOS transistor having the <100> channel direction and an n-channel MOS transistor into a complementary semiconductor device, it is necessary to obtain the relationship between the channel direction and electron mobility in SiGe mixed crystal.

Figure 8:
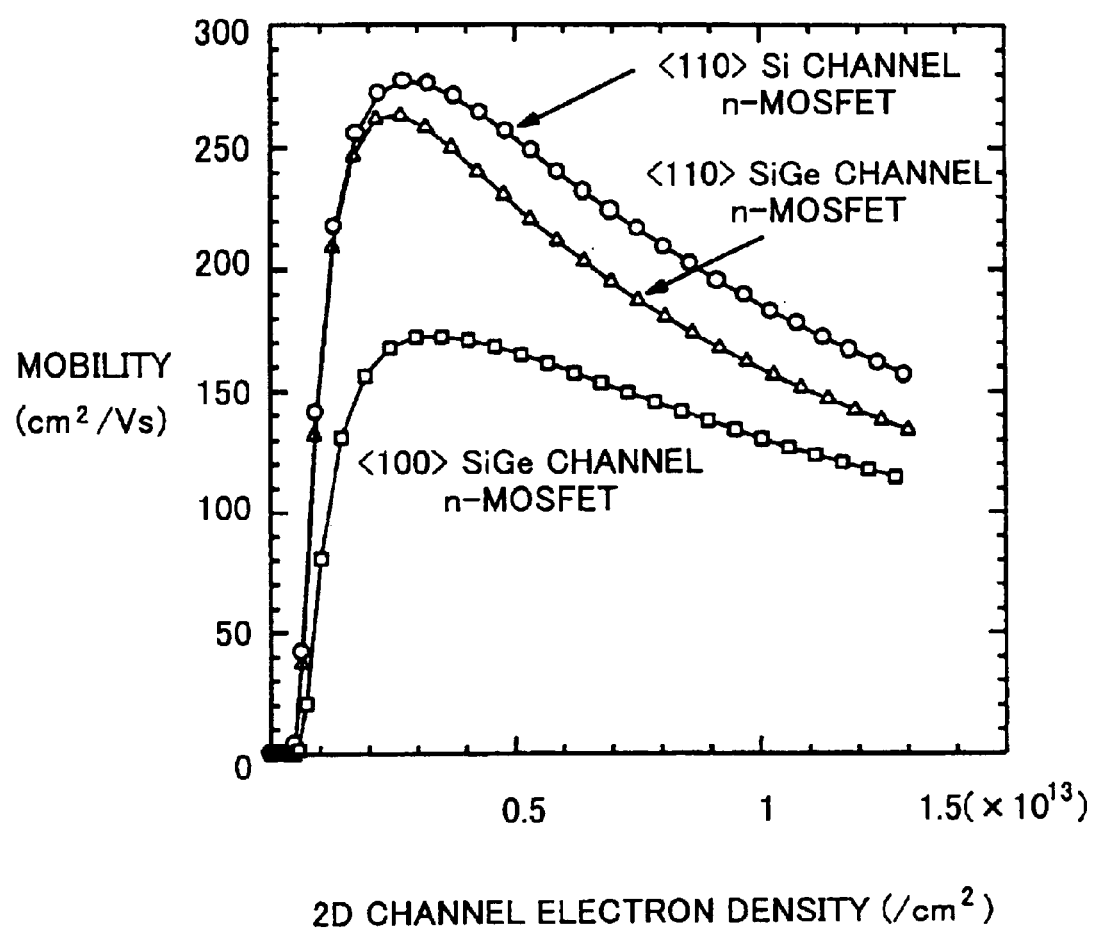
FIG. 8 is a diagram showing the operation characteristics of an n-channel MOS transistor having a variety of directions.

FIG. 8 shows, in comparison, the electron mobility of the n-type MOS transistor in the case of setting the channel direction to <100> in SiGe mixed crystal, in the case of setting the channel direction to <110> in SiGe mixed crystal, and in the case of setting the channel direction to <110> in Si crystal.

FIG. 8 shows that the electron mobility of the n-type MOS transistor is the lowest in the case of forming the channel in the <100> direction in the SiGe layer, and the highest in the case of forming the channel in the <110> direction in the Si layer. The electron mobility in the case of forming the channel in the <110> direction in the SiGe layer falls between those of the two cases.

Figure 9:
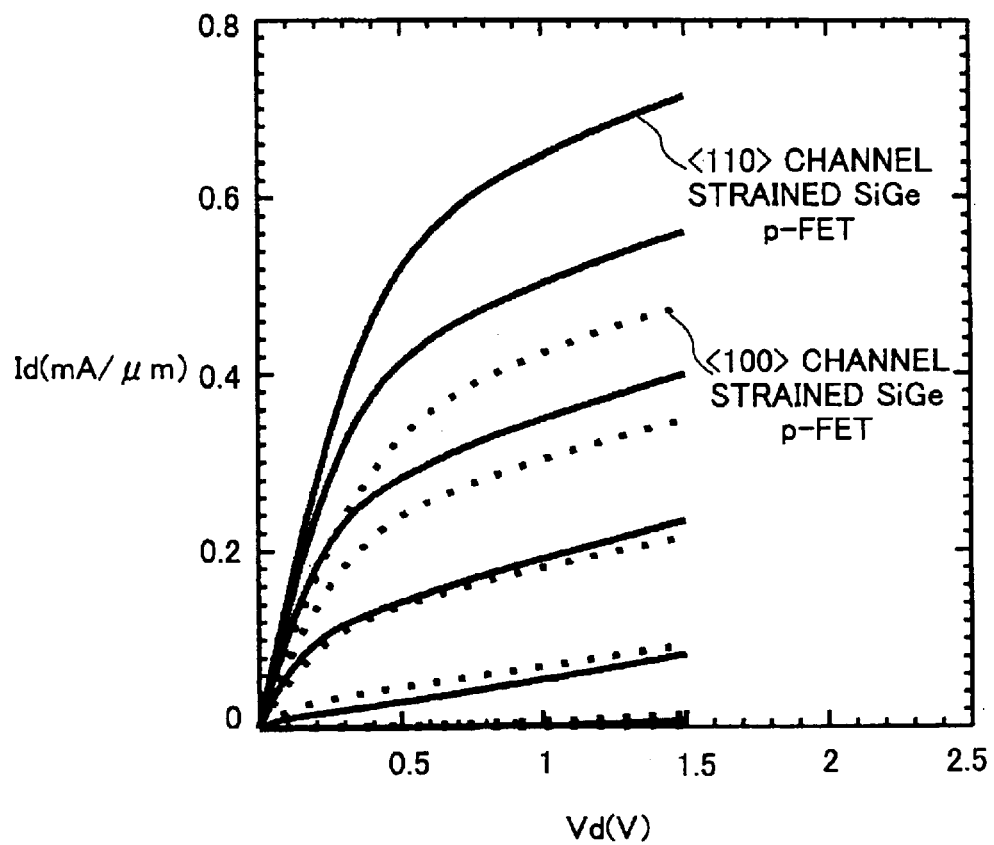
FIG. 9 is another diagram showing the operation characteristics of the n-channel MOS transistor having a variety of directions.

Accordingly, as shown in FIG. 9, the current-voltage characteristics of the n-channel MOS transistor are significantly degraded in the case of setting the channel direction to <100> in the SiGe mixed crystal layer compared with the case of setting the channel direction to <110> in the SiGe mixed crystal layer.

Therefore, in the case of integrating a p-channel MOS transistor having its channel in the <100> direction in a SiGe mixed crystal layer with an n-channel MOS transistor having its channel in the <100> direction, the operation speed of the p-channel MOS transistor increases while that of the n-channel MOS transistor decreases. Accordingly, it is difficult to configure a desired complementary semiconductor device whose p-channel and n-channel MOS transistors both operate at high speed.

Figure 10:
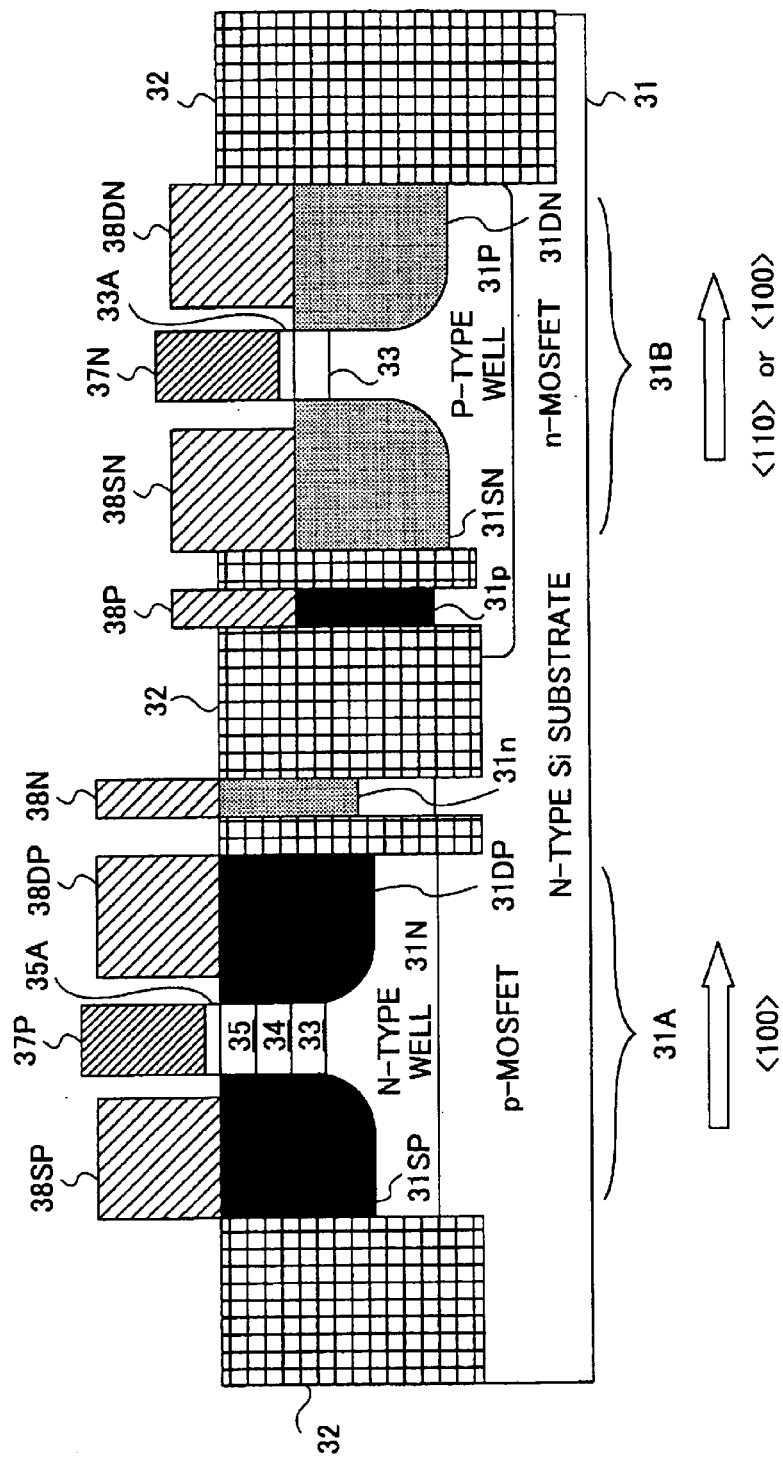
FIG. 10 is a diagram showing a configuration of a complementary semiconductor device according to a second embodiment of the present invention.

FIG. 10 is a diagram showing the configuration of a complementary semiconductor integrated circuit (IC) device 30 in which the above-described disadvantage is eliminated according to a second embodiment of the present invention.

According to FIG. 10, the complementary semiconductor IC device 30 is formed on an n-type Si substrate 31. In the n-type Si substrate 31, a p-channel MOS region 31A where a p-channel MOS transistor is formed and an n-channel MOS region 31B where an n-channel MOS transistor is formed are formed isolated by an isolation structure 32.

In the p-channel MOS region 31A, an n-type well 31N is formed in the Si substrate 31. On the n-type well 31N, an n-type Si buffer layer 33, an n-type SiGe channel layer 34, and an n-type Si cap layer 35 are successively grown epitaxially as in the above-described p-channel MOS transistor of FIG. 5.

An oxide film 35A is formed on the Si cap layer 35 as a gate insulating film so as to cover a channel region. A gate electrode 37P is formed on the oxide film 35A. The upper portion of part of the Si substrate 31 which part forms the Si cap layer 35, the SiGe mixed crystal layer 34, the Si buffer layer 33, and the n-type well 31N is p-type doped in its part adjacent to the gate electrode 37P in the <100> direction so that a source region 31SP and a drain region 31DP are formed. A source electrode 38SP is formed on the source region 31SP and a drain electrode 38DP is formed on the drain region 31DP.

Further, in the n-type well 31N, an n-type contact region (body contact region) 31n is formed so as to extend across the layers 33 through 35. A contact electrode (body electrode) 38N is formed on the n-type contact region 31n.

On the other hand, in the n-channel MOS region 31B, a p-type well 31P is formed in the Si substrate 31. An n-channel MOS transistor using the Si buffer layer 33 as a channel layer is formed on the p-type well 31P.

More specifically, in the n-channel MOS region 31B, the Si buffer layer 33 is p-type doped as is the p-type well 31P, and an oxide film 33A is formed as a gate insulating film on the Si buffer layer 33 so as to cover a channel region. A gate electrode 37N is formed on the gate insulating film 33A. The upper portion of part of the Si substrate 31 which part forms the Si buffer layer 33 and the p-type well 31P is n-type doped in its part adjacent to the gate electrode 37N in the <110> or <100> direction so that a source region 31SN and a drain region 31DN are formed. A source electrode 38SN is formed on the source region 31SN and a drain electrode 38DN is formed on the drain region 31DN.

Further, in the p-type well 31P, a p-type contact region (body contact region) 31p is formed so as to extend across the Si buffer layer 33. A contact electrode (body electrode) 38P is formed on the p-type contact region 31p.

In the complementary semiconductor IC device 30 of the foregoing structure, isotropic compressive strain is stored in the in-plane direction in the SiGe mixed crystal layer 34 forming the channel layer of the p-channel MOS transistor, and by setting the channel direction to <100>, the hole mobility of the p-channel MOS transistor is maximized as previously described.

Meanwhile, in the n-channel MOS transistor, the SiGe mixed crystal layer 34 is removed so that the electron channel is formed in the Si buffer layer 33. As a result, the problem of a decrease in the mobility and the drain current caused by forming an electron channel in the SiGe mixed crystal layer 34, which is previously described with reference to FIGS. 8 and 9, can be avoided, thereby ensuring the high-speed operation of the n-channel MOS transistor. At this point, the electron channel direction may be set to either <100> or <110>. The relationships shown in FIGS. 8 and 9, however, show that the n-channel MOS transistor can operate at higher speeds with the <110> channel direction than with the <100> channel direction.

A description will now be given, with reference to FIGS. 11A through 11H, of a process of manufacturing the complementary semiconductor IC device 30 of FIG. 10.

In the step of FIG. 11A, the Si buffer layer 33, the SiGe mixed crystal layer 34, and the Si cap layer 35 are successively formed on the n-type Si substrate 31 by epitaxial growth, so that a semiconductor layer structure storing compressive stress that works isotropically in the in-plane direction in the SiGe mixed crystal layer 34 is formed.

In the step of FIG. 11B, the isolation structure 32 is formed by shallow trench isolation (STI) in the semiconductor layer structure of FIG. 11A, so that the p-channel MOS region 31A and the n-channel MOS region 31B are formed isolated from each other in the Si substrate 31. As is well known, the STI structure is formed by forming an isolation groove and filling the isolation groove with a Si oxide film.

Figure 1:
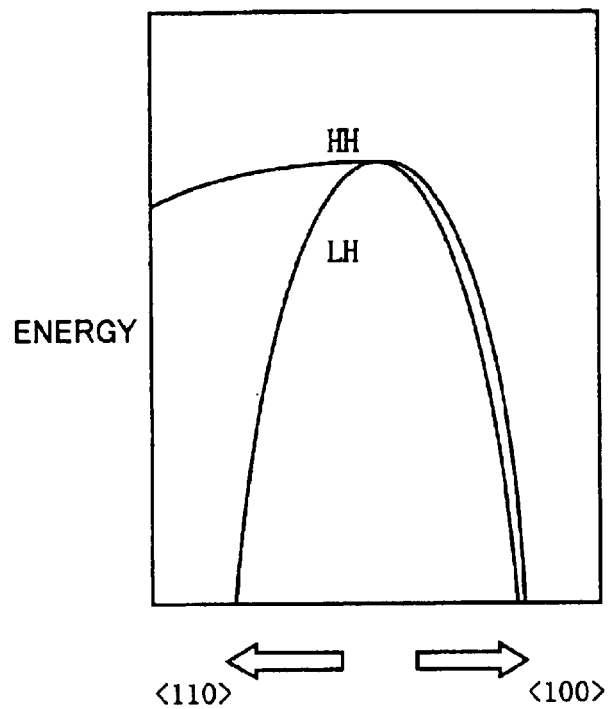
FIG. 1 is a diagram showing a valence band structure of Si crystal.
Figures 11C, 11D:
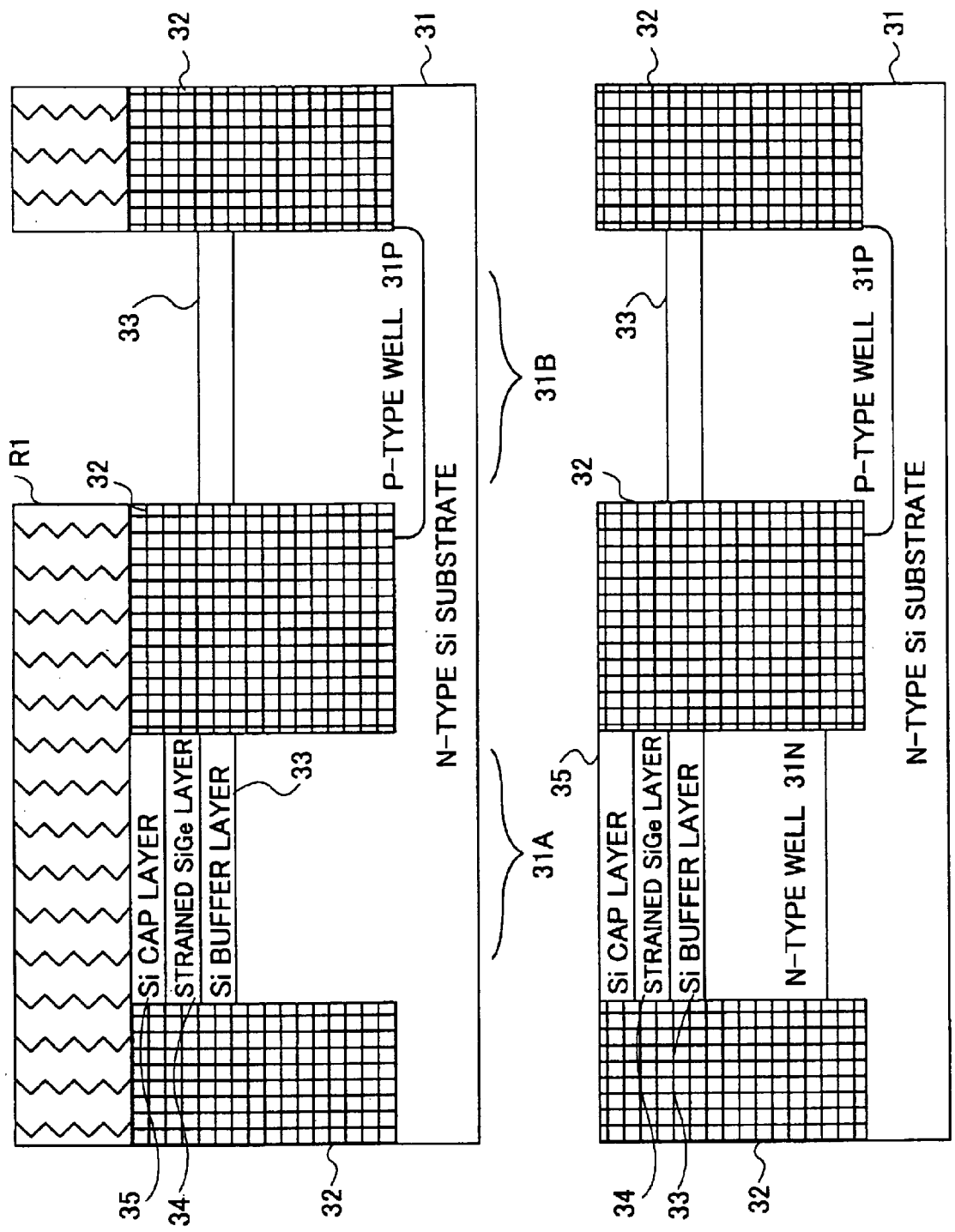

Next, in the step of FIG. 1C, a resist pattern R1 is formed on the structure of FIG. 11B so as to expose the n-channel MOS region 31B, and the Si cap layer 35 and the SiGe mixed crystal layer 34 are successively removed by etching with the resist pattern R1 serving as a mask. Further, in the step of FIG. 11C, a p-type impurity such as B is ion-implanted with a concentration of approximately $1 \times 10^{17}$ $cm^{-3}$ using the resist pattern R1 as a mask, so that in the n-channel MOS region 31B, the Si buffer layer 33 is doped p-type and the p-type well 31P is formed in the Si substrate 31.

Next, in the step of FIG. 1D, the resist pattern R1 is removed, and an n-type impurity such as As or P is ion-implanted into the p-channel MOS region 31A with a concentration of approximately $1 \times 10^{17}$ $cm^{-3}$ using another resist pattern (not shown in the drawing) as a mask. Thereby, the n-type well 31N corresponding to the p-channel MOS region 31A is formed in the Si substrate 31, and at the same time, the Si cap layer 35, the SiGe mixed crystal layer 34, and the Si buffer layer 33 are doped n-type.

Figures 11E, 11F:
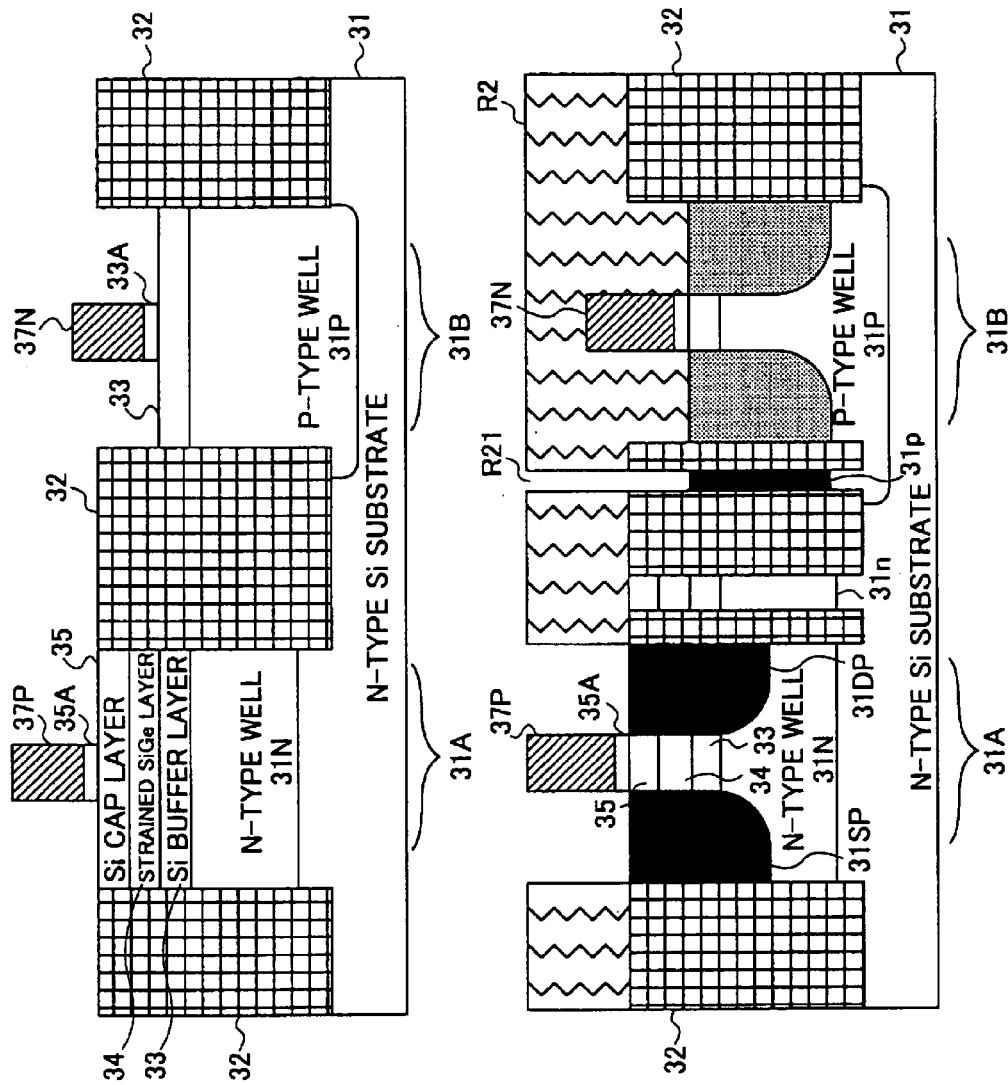

Further, in the step of FIG. 11E, the Si cap layer 35 and the Si buffer layer 33 are thermally oxidized in the p-channel and n-channel MOS regions 31A and 31B, respectively, so that the respective gate insulating films 35A and 33A are formed to be approximately 3 nm in thickness. The gate electrodes 37P and 37N are formed on the gate insulating films 35A and 33A, respectively, by depositing and patterning a polysilicon film.

Then, in the step of FIG. 11F, a resist pattern R2 is formed on the structure of FIG. 11E so as to expose the p-channel MOS region 31A. Using the resist pattern R2 as a mask, ion implantation of a p-type impurity such as B is performed, so that the p-type source region 31SP and the p-type drain region 31DP are formed self-aligned with respect to the gate electrode 37P in the p-channel MOS region 31A.

The position of the cross section of FIG. 11F is slightly deviated from that of the cross section of FIG. 1E, so that the contact regions 31n and 31p remaining in the isolation structure 32 are shown in FIG. 11F. The Si cap layer 35 is exposed in the contact region 31n, and the Si buffer layer 33 is exposed in the contact region 31p.

In the step of FIG. 11F, at the same time that the source region 31SP and the drain region 31DP are formed, ion implantation is also performed in the contact region 31p through an opening part R21 formed in the resist pattern R2 so that the contact region 31p is doped p-type.

Next, in the step of FIG. 11G, the resist pattern R2 is removed, and using another resist pattern R3 as a mask for exposing the n-channel MOS region 31B, an n-type impurity such as As or P is ion-implanted into the n-channel MOS region 31B, so that the n-type source region 31SN and the n-type drain region 31DN are formed self-aligned with respect to the gate electrode 37N. At the same time, the contact region 31n is doped n-type.

Finally, in the step of FIG. 11H, the resist pattern R3 is removed, and the source electrode 38SP, the drain electrode 38DP, the source electrode 38SN, and the drain electrode 38DN are formed so as to correspond to the source region 31SP, the drain region 31DP, the source region 31SN, and the drain region 31DN, respectively. Further, the contact electrodes 38N and 38P are formed so as to correspond to the contact regions 31n and 31p, respectively.

Figure 12:
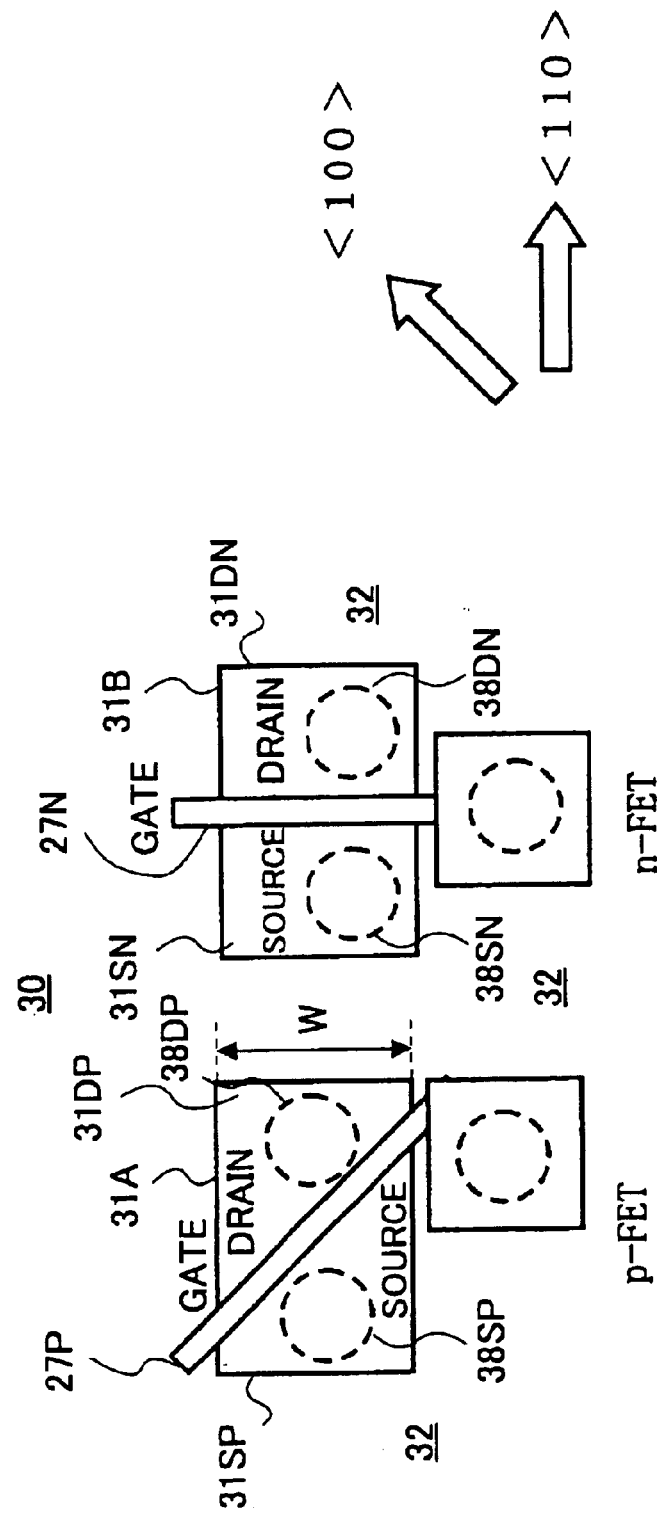
FIG. 12 is a plan view of the complementary semiconductor device of FIG. 10 according to the second embodiment of the present invention.

FIG. 12 is a plan view of the complementary semiconductor IC device 30 of FIG. 10, showing the arrangement of the p-channel and n-channel MOS transistors. In FIG. 12, the contact regions 31n and 31p are not shown.

FIG. 12 shows that the n-channel MOS transistor has its channel direction set to <110>, and that the p-channel MOS region 31A of the p-channel MOS transistor and the n-channel MOS region 31B of the n-channel MOS transistor have a rectangular shape of substantially the same size.

Particularly, the p-channel MOS transistor and the n-channel MOS transistor have substantially the same size W, which is a size corresponding to the channel width. This can be attributed to the effect of the increased mobility of the p-channel MOS transistor as previously described with reference to FIG. 6 and the effect of the extension of the channel of the p-channel MOS transistor along the <100> direction, which is inclined with respect to the channel direction of the n-channel MOS transistor.

Figure 13:
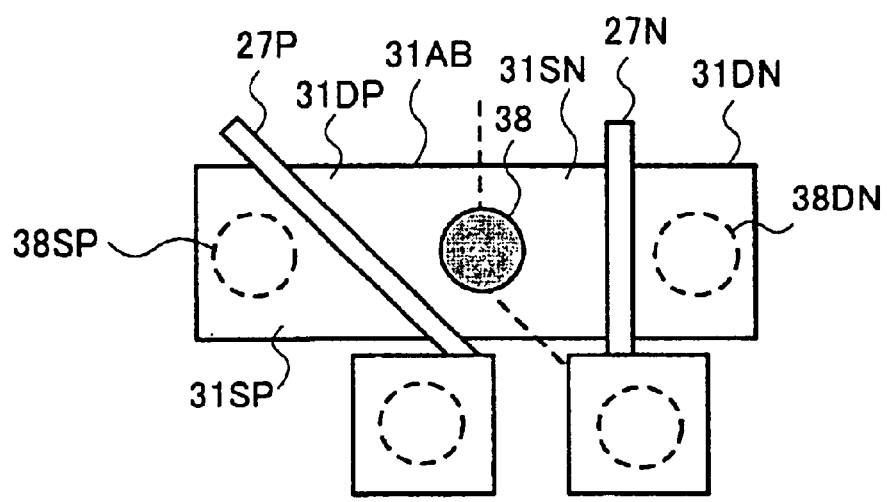
FIG. 13 is a diagram showing a first variation of the complementary semiconductor device of FIG. 10 according to the second embodiment of the present invention.

Therefore, according to the complementary semiconductor device of the present invention, the p-channel MOS region 31A and the n-channel MOS region 31B may be connected to form a single rectangular device region 31AB as shown in FIG. 13. In this case, a common electrode 38 common to the p-type drain region 31DP and the n-type source region 31SN is formed so as to correspond to the drain electrode 38DP and the source electrode 38SN. According to the configuration of FIG. 13, a complementary MOS circuit can be formed without wiring connection of the drain electrode 38DP and the source electrode 38SN.

Figure 14:
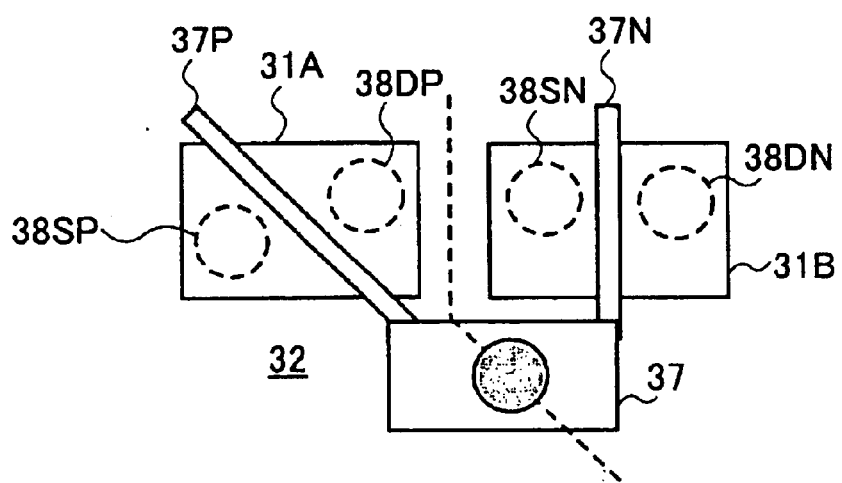
FIG. 14 is a diagram showing a second variation of the complementary semiconductor device of FIG. 10 according to the second embodiment of the present invention.

FIG. 14 is a diagram showing another variation of the complementary semiconductor IC device 30 of FIG. 10.

According to the variation of FIG. 14, the device region 31A and the device region 31B are isolated from each other by the isolation structure 32, while the gate electrode 37P and the gate electrode 37N are connected at a common electrode pad 37. According to the configuration of FIG. 14, the interconnection line connecting the gate electrodes 37P and 37N is omittable.

Figure 15:
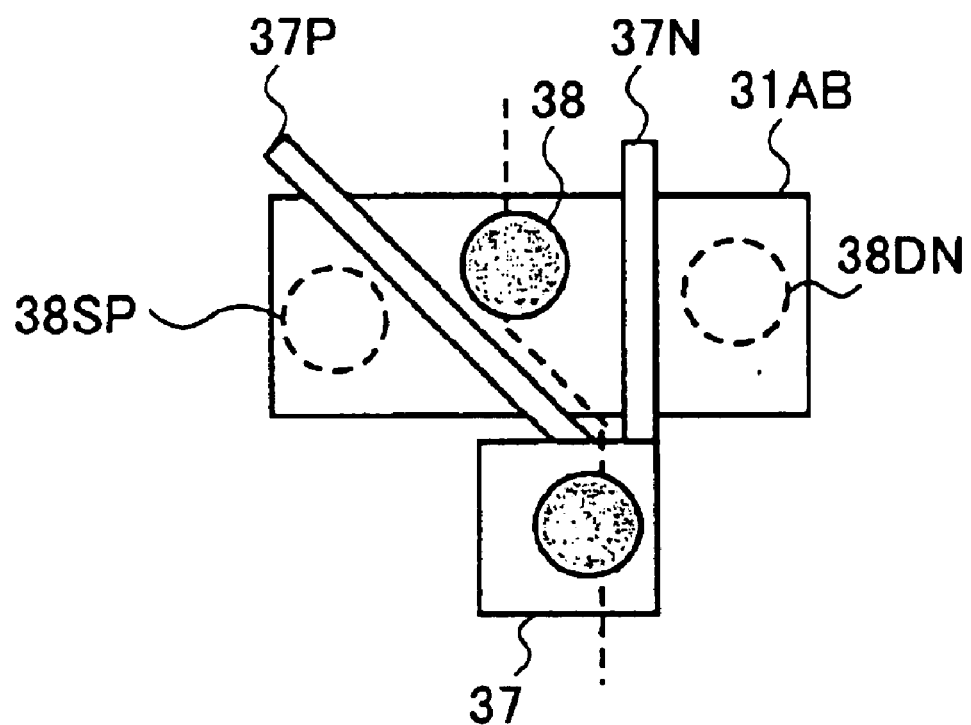
FIG. 15 is a diagram showing a third variation of the complementary semiconductor device of FIG. 10 according to the second embodiment of the present invention.

FIG. 15 is a diagram showing yet another variation of the complementary semiconductor IC device 30 of FIG. 10.

According to the variation of FIG. 15, the device region 31A and the device region 31B are connected to form the rectangular device region 31AB as in the variation of FIG. 13, and further, the gate electrodes 37P and 37N are connected at the common electrode pad 37.

The configuration of FIG. 15 allows the entire complementary semiconductor device to be compact in size, thus being effective in increasing integration density.

[Third Embodiment]

Figure 16:
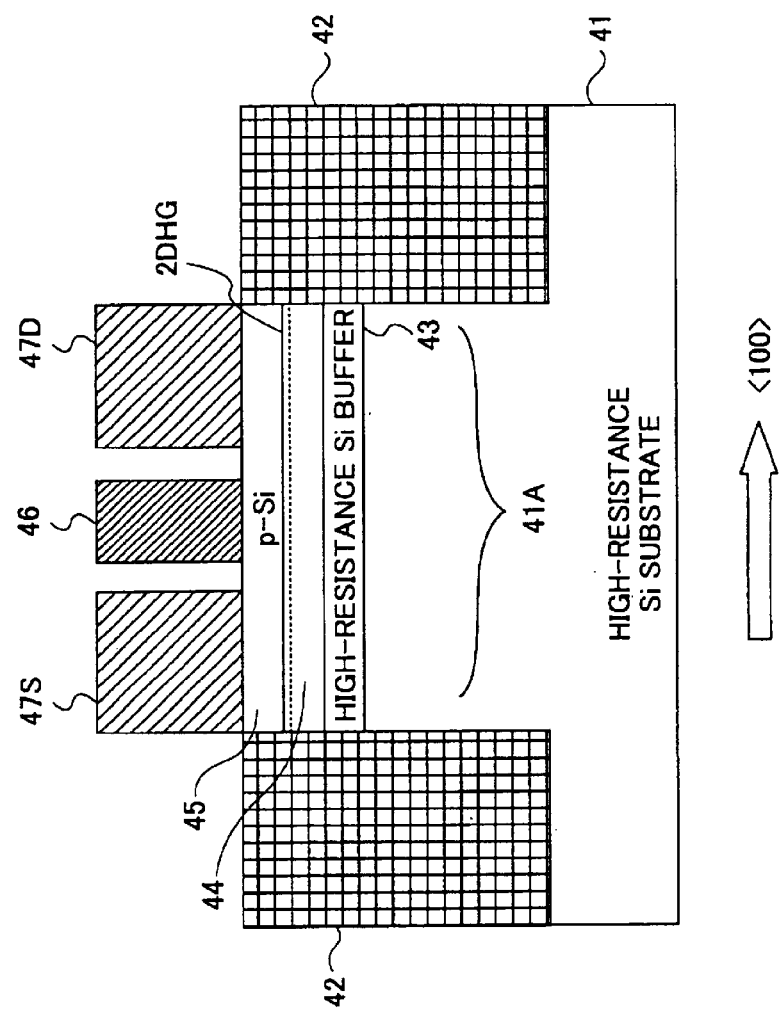
FIG. 16 is a diagram showing a configuration of a modulation-doped semiconductor device according to a third embodiment of the present invention.

FIG. 16 is a diagram showing the configuration of a modulation-doped field-effect transistor (MODFET) 40 according to a third embodiment of the present invention.

According to FIG. 16, the MODFET 40 is formed on a device region 41A isolated by an isolation structure 42 by STI on a high-resistance Si substrate 41 preferably having a specific resistance of 100 Ω·cm or higher. The MODFET 40 includes a semiconductor layer structure formed of a high-resistance Si buffer layer 43 grown epitaxially on the Si substrate 41 to preferably have a specific resistance of 100 Ω·cm or higher, a channel layer 44 formed of a SiGe mixed crystal layer grown epitaxially on the Si buffer layer 43, and a p-type Si hole supply layer 45 grown epitaxially on the SiGe mixed crystal layer 44.

The SiGe mixed crystal layer 44 is formed on the Si substrate 41 by epitaxial growth so as to store compressive strain that is exerted isotropically in the in-plane direction. The film thickness of the SiGe mixed crystal layer 44 is set to a value that does not exceed the critical film thickness at which a defect such as dislocation occurs. In this semiconductor layer structure, a two-dimensional hole gas (2DHG) is formed as a carrier in the SiGe mixed crystal layer 44 along the interface with the hole supply layer 45.

Further, a gate electrode 46 of a material such as aluminum is formed on the Si hole supply layer 45 in Schottky contact therewith so as to correspond to the channel region. A source electrode 47S and a drain electrode 47D are formed on the opposing sides of the gate electrode 46 on the Si hole supply layer 45 in ohmic contact therewith.

According to the MODFET 40 of the present invention, the source and drain electrodes 47S and 47D are aligned in the <100> direction, so that the channel region formed right under the gate electrode 46 is oriented in the <100> direction that maximizes the hole mobility. As a result, the MODFET 40 operates at a much higher speed than the conventional p-channel MOSFET having the <110> channel direction.

In the above-described embodiments, the MOSFET or MODFET is formed on the surface of the (000) Si substrate, which does not mean, however, that the field-effect semiconductor device of the present invention should be formed strictly on the (001) surface of the Si substrate. Generally, in a Si substrate commercially available as a (001) Si substrate, the main surface is allowed to have an inclination of approximately ±0.5° to the (001) surface. The present invention is effective on a substrate having such a slight inclination if the inclination angle is within the range of ±25°

Further, in the foregoing description, the channel layer of the p-channel MOS transistor is SiGe mixed crystal. This does not mean, however, that the channel layer is limited to the SiGe binary mixed crystal. The mixed crystal may contain a small amount of another element such as C.

Thus, according to the present invention, in a semiconductor device in which a heavy-hole band and a light-hole band are separated in a channel layer by the effect of compressive stress applied thereto isotropically in an in-plane direction, hole mobility in the channel layer can be maximized by setting the channel direction in which holes are transported preferably to around <100> instead of conventional <110>. Thereby, the operation speed of the p-channel field effect transistor (FET) can be maximized.

Further, according to the present invention, by forming a p-channel FET and an n-channel FET on a common Si substrate in a direction to particularly maximize the hole mobility of the p-channel FET, that is, by forming the p-channel and n-channel FETs in different directions, the hole mobility, or the operation speed, of the p-channel FET is maximized, while the electron mobility, or the operation speed, of the n-channel FET is prevented from being reduced. In such a complementary semiconductor device, the difference between the hole mobility of the p-channel and the electron mobility of the n-channel FETs can be reduced, so that the two transistors can be formed in a simple rectangular device region, which is advantageous in terms of integration. Therefore, the integration density of a semiconductor integrated circuit can be increased.

The present invention is not limited to the specifically disclosed embodiments, but variations and modifications may be made without departing from the scope of the present invention.

What is claimed is:

1. A semiconductor device comprising:
   a channel layer;
   a gate electrode formed on said channel layer;
   a p-type source region formed on a first side of said channel layer; and
   a p-type drain region formed on a second side of said channel layer,
   wherein:
   a heavy-hole band and a light-hole band are separated by compressive strain applied isotropically in an in-plane direction in said channel layer; and a channel direction connecting said p-type source and drain regions is set substantially to a direction to maximize hole mobility in said channel layer;

wherein:

said channel layer is formed of a mixed crystal layer including at least Si and Ge, the mixed crystal layer being grown epitaxially on a Si substrate whose main surface is substantially a (001) crystal surface;

the channel direction is set to a direction other than a <110> direction; and the channel direction is set at an angle within ±25° to a <100> direction.

2. The semiconductor device as claimed in claim 1, wherein the channel direction is set substantially to a <100> direction.

3. The semiconductor device as claimed in claim 1, wherein:

a Si layer is formed between said channel layer and said gate electrode; and said gate electrode is formed on an oxide film formed on said Si layer.

4. The semiconductor device as claimed in claim 1, wherein:

a p-type Si layer is formed between said channel layer and said gate electrode; and a two-dimensional hole gas is formed in said channel layer along an interface with said p-type Si layer.

5. The semiconductor device as claimed in claim 1, wherein the mixed crystal layer is SiGe-based binary mixed crystal.

6. The semiconductor device as claimed in claim 5, wherein the SiGe-based binary mixed crystal contains zero through 80 atomic percent Ge.

7. The semiconductor device as claimed in claim 1, wherein the mixed crystal layer is SiGeC-based ternary mixed crystal.

8. A complementary semiconductor device comprising:

a Si substrate whose main surface is substantially a (001) crystal surface;

a p-channel field-effect transistor (FET) formed in a first region of said Si substrate; and an n-channel field-effect transistor (FET) formed in a second region of said Si substrate, wherein:

said p-channel FET comprises:

a p-channel region formed of a mixed crystal layer including at least Si and Ge and storing compressive strain, the mixed crystal layer grown epitaxially in the first region on said Si substrate;

a first gate electrode formed on said p-channel region;

a p-type first diffusion region formed on a first side of said p-channel region; and a p-type second diffusion region formed on a second side of said p-channel region;

said n-channel FET comprises:

an n-channel region formed of a Si layer grown epitaxially in the second region on said Si substrate;

a second gate electrode formed on said n-channel region;

an n-type third diffusion region formed on a first side of said n-channel region; and an n-type fourth diffusion region formed on a second side of said n-channel region; and a channel direction connecting said first and second diffusion regions is set to a direction deviating from a <110> direction in said p-channel FET.

9. The complementary semiconductor device as claimed in claim 8, wherein:

a Si buffer layer is formed between said Si substrate and the mixed crystal layer in the first region of said Si substrate; and the Si layer forming said n-channel region is part of said Si buffer layer.

10. The complementary semiconductor device as claimed in claim 8, wherein the channel direction of said p-channel FET is set substantially to a <100> direction.

11. The complementary semiconductor device as claimed in claim 8, wherein the channel direction of said p-channel FET is different from a channel direction connecting said third and fourth diffusion regions of said n-channel FET.

12. The complementary semiconductor device as claimed in claim 8, wherein said p-channel region and said n-channel region have rectangular shapes substantially equal in size.

13. The complementary semiconductor device as claimed in claim 8, wherein said p-channel region and said n-channel region are connected to form a single rectangular device region.

14. The complementary semiconductor device as claimed in claim 8, wherein said first gate electrode and said second gate electrode are connected at a common electrode part.

* * * * *